United States Patent [19]
Deguchi

[11] Patent Number: 4,833,340
[45] Date of Patent: May 23, 1989

[54] PHASE SHIFTER

[75] Inventor: Takumi Deguchi, Tokyo, Japan

[73] Assignee: Nec Corporation, Japan

[21] Appl. No.: 231,517

[22] Filed: Aug. 11, 1988

[30] Foreign Application Priority Data

Aug. 21, 1987 [JP] Japan ................ 62-206381

[51] Int. Cl.$^4$ .................. H03K 5/00; H03K 1/12; H03K 3/023; H03K 19/86
[52] U.S. Cl. ................... 307/262; 307/356; 307/494; 307/511; 307/522; 328/155; 329/145
[58] Field of Search ............ 329/124, 145; 328/166, 328/155; 307/262, 494, 511, 512, 355, 356–358, 522, 455; 330/295, 310

[56] References Cited

U.S. PATENT DOCUMENTS

| | | | |
|---|---|---|---|
| 3,508,161 | 4/1970 | Bingham | 307/262 |
| 3,597,639 | 8/1971 | Harwood | 307/262 |
| 3,617,855 | 11/1971 | Hisatsu | 307/262 |
| 3,852,624 | 12/1974 | Marik | 307/295 |
| 3,922,602 | 11/1975 | Lunguist | 307/512 |
| 4,052,679 | 10/1977 | Hosoya | 330/261 |
| 4,322,642 | 3/1982 | Sugasawa | 307/522 |
| 4,532,440 | 7/1985 | Barre | 307/455 |
| 4,549,142 | 10/1985 | Yoshida | 329/124 |
| 4,560,888 | 12/1985 | Oida | 307/272 |
| 4,617,475 | 10/1986 | Reinschmidt | 307/441 |
| 4,663,594 | 5/1987 | Perkins | 328/155 |

FOREIGN PATENT DOCUMENTS 0271953 6/1988 European Pat. Off. ............ 330/310
61-157019 7/1986 Japan.

Primary Examiner—Stanley D. Miller
Assistant Examiner—Nancy Thai
Attorney, Agent, or Firm—Laff, Whitesel, Conte & Saret

[57] ABSTRACT

A phase shifter includes two phase shift circuits connected in parallel with each other between an input terminal for a signal of a voltage $e_i$ and ground and each consisting of a series circuit of a resistor and a capacitor, first and second differential amplifiers for receiving at their first terminals voltages $e_1$ and $e_2$ of junctions between the resistors and the capacitors of the phase shift circuits and for receiving input signals at the second input terminals, the collectors of noninverting and inverting transistors of the first differential amplifier being connected to the collectors of inverting and noninverting transistors of the second amplifier, respectively, thereby obtaining a vector sum $e_0$ of $e_1$ and $\overline{e_2}$, and a third differential amplifier consisting of two transistors having the first and second differential amplifiers as loads at their collector sides, respectively, and capable of arbitrarily changing a phase shift between the input signal $e_i$ and the output $e_0$ in accordance with a voltage difference between the signals supplied to the bases of the two transistors.

2 Claims, 1 Drawing Sheet

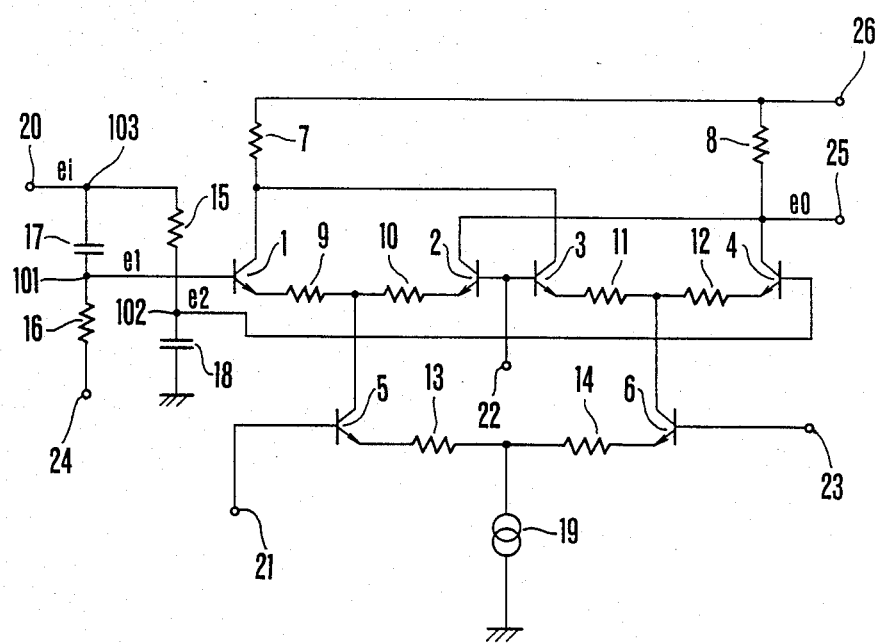
F I G. 1
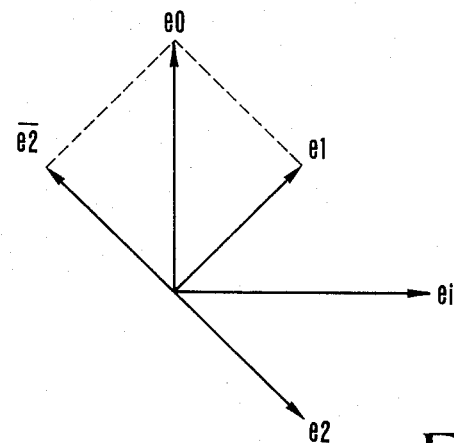
F I G. 2

PHASE SHIFTER

BACKGROUND OF THE INVENTION

The present invention relates to a phase shifter used in a demodulator of a digital-signal-modulated carrier wave transmission system.

In a demodulator for demodulating a digital-signal-modulated carrier wave, a modulated signal input to the demodulator is supplied to two phase detectors, and output signals having predetermined phase angles shifted through, e.g., 90° from each other are supplied from the two phase detectors. Therefore, a reference carrier signal from a VCO or the like is directly supplied to one phase detector and to the other phase detector through a 90°-phase shifter. A control signal is supplied to the phase shifter so that the output from the phase shifter always accurately maintains a phase difference of 90° with respect to the output from the VCO.

A conventional phase shifter used in a digital demodulator is disclosed in U.S. Pat. No. 4,549,142. This phase shifter is arranged using an LC circuit and therefore has frequency dependency. For this reason, when this phase shifter is mounted on a printed circuit board or the like, a phase shift is easily adversely affected by a parts arrangement. Therefore, this phase shifter is not suitable for an LSI arrangement.

Japanese Patent Laid-Open No. 61-157019 discloses various phase shifters using not an inductance but a capacitor, a resistor, and a transistor, thereby eliminating the above drawback. However, a phase shift amount cannot vary in these phase shifters.

SUMMARY OF THE INVENTION

It is, therefore, an object of the present invention to eliminate the above conventional drawback and to provide a phase shifter which is not adversely affected by a parts arrangement, can change a phase shift amount, and therefore is suitable for an LSI arrangement.

According to the present invention, there is provided a phase shifter in a demodulator of a digital-signal-modulated carrier wave transmission system, comprising a first phase shift circuit, obtained by connecting a resistor and a capacitor in series with each other between an input terminal and a ground, for outputting from a junction between the resistor and the capacitor a first signal having a first predetermined phase difference with respect to an input signal to the input terminal, a second phase shift circuit, obtained by connecting a resistor and a capacitor between the input terminal and the ground in an order opposite to that of the first phase shift circuit, for outputting from a junction between the resistor and the capacitor a second signal having a second predetermined phase difference with respect to the input signal to the input terminal, a first differential amplifier having an inverting transistor for receiving the first signal output from the first phase shift circuit at a base thereof and a noninverting transistor for receiving a third signal at a base thereof, a second differential amplifier having an inverting transistor for receiving the second signal output from the second phase shift circuit at a base thereof and a noninverting transistor for receiving the third signal at a base thereof, a third differential amplifier consisting of noninverting and inverting transistors having the first and second differential amplifiers as loads at collectors thereof, respectively, for changing gains of the first and second differential amplifiers by changing voltages applied to bases thereof, respectively, vector-synthesizing means for connecting a collector of the noninverting transistor of the first differential amplifier with a collector of the inverting transistor of the second differential amplifier and connecting a collector of the inverting transistor of the first differential amplifier with a collector of the noninverting transistor of the second differential amplifier, thereby vector-synthesizing a noninverted output from the first differential amplifier with an inverted output from the second differential amplifier and an inverted output from the first differential amplifier with a noninverted output from the second differential amplifier, respectively, and output means for extracting an output signal of the phase shifter having an arbitrary phase difference with respect to the input signal from one of the collectors connected by the vector synthesizing means.

BRIEF DESCRIPTION OF THE DRAWINGS

FIG. 1 is a circuit diagram showing an arrangement of an embodiment of the present invention; and FIG. 2 is a vector diagram for explaining an operation of the circuit shown in FIG. 1.

DETAILED DESCRIPTION OF THE PREFERRED EMBODIMENT

An embodiment of the present invention will be described in detail below with reference to the accompanying drawings.

FIG. 1 is a circuit diagram showing an embodiment of a phase shifter according to the present invention.

In FIG. 1, an input terminal 20 for receiving a reference signal having a frequency $f_0$ and a voltage $e_i$ from, e.g., a VCO (not shown) is connected to one terminal of each of a resistor 15 and a capacitor 17. The other terminal of the resistor 15 is connected to one terminal of a capacitor 18, and the other terminal of the capacitor 18 is grounded.

The other terminal of the capacitor 17 is connected to the other terminal of the resistor 16, and the other terminal 24 of the resistor 16 is connected to a power source (not shown) which can be assumed to be grounded because its impedance with respect to the signal of frequency $f_0$ is regarded as zero.

The resistor 15 and the capacitor 18 constitutes a first phase shift circuit, and the capacitor 17 and the resistor 16 constitutes a second phase shift circuit.

A junction 101 between the capacitor 17 and the resistor 16 is connected to the base of the transistor 1. A junction 102 between the resistor 15 and the capacitor 18 is connected to the base of the transistor 4.

The transistor 1 together with a transistor 2 constitutes a first differential amplifier, and the transistors 4 together with a transistor 3 constitutes a second differential amplifier. That is, the collectors of the transistors 1 and 2 are connected to a power source terminal 26 through resistors 7 and 8, respectively, and their emitters are connected to a current source 19 through resistors 9 and 10, respectively, and through a transistor 5, the base of which is connected to a terminal 21, and a resistor 13.

The collectors of the transistors 3 and 4 are connected to the power source terminal 26 through the resistors 7 and 8, respectively, and their emitters are connected to the current source 19 through the resistors 11 and 12, respectively, and through a transistor 6, the base of which is connected to a terminal 23, and a resistor 14.

The transistors 5 and 6 constitute a third differential amplifier having the first and second differential amplifiers as loads respectively at the collector sides of the transistors 5 and 6 and receiving controll signals supplied from the terminals 21 and 23 respectively at their bases.

The bases of the transistors 2 and 3 are directly connected to a terminal 22.

The collector of the transistors 4 is connected to an output terminal 25 of the phase shifter.

An operation of the phase shifter shown in FIG. 1 will be described below.

FIG. 2 is a vector diagram showing an operational principle of the circuit shown in FIG. 1.

Assuming that a frequency of an input signal to the input terminal 20 is f, voltages $e_1$ and $e_2$ at the junctions 101 and 102 are represented by the following equations, respectively:

$$e_1 = \frac{1}{1 + (f_0/f)^2} \left(1 + j\frac{f}{f_0}\right) \cdot e_i \quad (1)$$

$$e_2 = \frac{1}{1 + (f/f_0)^2} \left(1 - j\frac{f}{f_0}\right) \cdot e_i \quad (2)$$

where $f_0$ is $\frac{1}{2}\pi RC$ which is a constant determined by resistances R of the resistors 15 and 16 and capacitances C of the capacitors 17 and 18.

In the equations (1) and (2), when $f = f_0$, a phase of the voltage $e_1$ advances by 45° from that of the voltage $e_i$, that of the voltage $e_2$ is delayed by 45° from that of the voltage $e_i$, and $|e_1| = |e_2|$ (where that $|e_1|$ and $|e_2|$ are absolute values of the voltages $e_1$ and $e_2$, respectively).

As shown in FIG. 2, a vector sum $e_0$ of a voltage $\overline{e_2}$ obtained by inverting the voltage $e_2$ and the voltage $e_1$ is a signal having a phase difference of 90° with respect to the input voltage $e_i$ at a frequency of $f = f_0$. The phase difference between $e_i$ and $e_0$ is 90° when $|e_1| = |\overline{e_2}|$ and is a value other than 90° when $|e_1| \neq |\overline{e_2}|$.

A circuit constituted by the transistors 1 to 6 in FIG. 1 synthesizes the vectors $e_1$ and $\overline{e_2}$ to obtain the output signal $e_0$ having an arbitrary phase difference with respect to the input signal $e_i$ at the output terminal 25.

When the voltages applied to the terminals 21 and 22 are equal to each other, absolute values of voltages generated at the collectors of the transistors 2 and 4 are equal to each other at $f = f_0$, having a phase difference of 90° therebetween, and have phase differences of 45° and 135° with respect to the input signal $e_i$, respectively. Therefore, as shown in FIG. 2, the output signal from the output terminal 25 has a phase difference of 90° with respect to the input signal.

When the voltages applied to the terminals 21 and 23 are different, gains of the first and second differential amplifiers differ from each other in accordance with the potential difference. Therefore, absolute values of voltages generated at the collectors of the transistors 2 and 4 differ from each other, and the output signal from the output terminal 25 has a phase difference other than 90° with respect to the input signal. In this manner, this circuit operates as a 90°-phase shifter capable of changing a phase shift amount in accordance with the voltages applied to the terminal 21 or 23.

In the above description, the present invention is applied to a 90°-phase shifter. However, the present invention is not limited to the above embodiment but can shift arbitrary phase amounts. In this case, different resistances may be given to the resistors 15 and 16 or different capacitances may be given to the capacitors 17 and 18. As a result, the phase difference between $e_1$ and $e_2$ in FIG. 2 differs from 90°, and therefore the circuit of the present invention operates not as a 90°-phase shifter but as a phase shifter having an arbitrary phase shift amount. In this case, it is apparent that when the terminals 21 and 23 have a potential difference therebetween as in the 90°-phase shifter, a phase shift amount of an output can be changed in accordance with the potential difference.

As has been described above, the phase shifter of the present invention can perform arbitrary phase shift and can change its phase shift amount.

What is claimed is:

1. A phase shifter in a demodulator of a digital-signal-modulated carrier wave transmission system, comprising:

a first phase shift circuit, obtained by connecting a resistor and a capacitor in series with each other between an input terminal and a ground, for outputting from a junction between said resistor and said capacitor a first signal having a first predetermined phase difference with respect to an input signal to said input terminal;

a second phase shift circuit, obtained by connecting a resistor and a capacitor between said input terminal and said ground in an order opposite to that of said first phase shift circuit, for outputting from a junction between said resistor and said capacitor a second signal having a second predetermined phase difference with respect to the input signal to said input terminal;

a first differential amplifier having an inverting transistor for receiving the first signal output from said first phase shift circuit at a base thereof and a noninverting transistor for receiving a third signal at a base thereof;

a second differential amplifier having an inverting transistor for receiving the second signal output from said second phase shift circuit at a base thereof and a noninverting transistor for receiving the third signal at a base thereof;

a third differential amplifier consisting of noninverting and inverting transistors having said first and second differential amplifiers as loads at collectors thereof, respectively, for changing gains of said first and second differential amplifiers by changing voltages applied to bases thereof, respectively;

vector-synthesizing means for connecting a collector of said noninverting transistor of said first differential amplifier with a collector of said inverting transistor of said second differential amplifier and connecting a collector of said inverting transistor of said first differential amplifier with a collector of said noninverting transistor of said second differential amplifier, thereby vector-synthesizing a noninverted output from said first differential amplifier with an inverted output from said second differential amplifier and an inverted output from said first differential amplifier with a noninverted output from said second differential amplifier; and output means for extracting an output signal of said phase shifter having an arbitrary phase difference with respect to the input signal from the collector connected by said vector synthesizing means.

2. A phase shifter according to claim 1, wherein emitters of said inverting and noninverting transistors of said first differential amplifier are connected to the collector of said inverting transistor of said third differential amplifier through corresponding resistors, and emitters of said inverting and noninverting transistors of said second differential amplifier are connected to the collector of said inverting transistor of said third differential amplifier through corresponding resistors.

* * * * *